(12) United States Patent
Bickford et al.

(10) Patent No.: US 7,013,441 B2
(45) Date of Patent: Mar. 14, 2006

(54) METHOD FOR MODELING INTEGRATED CIRCUIT YIELD

(75) Inventors: Jeanne P. Bickford, Essex Junction, VT (US); Edward K. Evans, Essex Junction, VT (US); Sean Horner, Burlington, VT (US); Raymond J. Rosner, Colchester, VT (US); Andrew Wienick, South Burlington, VT (US); Joseph Yoder, Oakton, VA (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 10/605,379

(22) Filed: Sep. 26, 2003

(65) Prior Publication Data

US 2005/0071788 A1    Mar. 31, 2005

(51) Int. Cl.
    *G06F 17/50*    (2006.01)
(52) U.S. Cl. .......................................................... 716/4
(58) Field of Classification Search ................ 716/4–5
    See application file for complete search history.

(56) References Cited

U.S. PATENT DOCUMENTS

| 5,539,652 A | * | 7/1996 | Tegethoff ...................... 703/14 |
| 6,449,749 B1 | * | 9/2002 | Stine .............................. 716/4 |
| 6,496,958 B1 | * | 12/2002 | Ott et al. ........................ 716/4 |
| 6,738,954 B1 | * | 5/2004 | Allen et al. .................... 716/4 |
| 6,751,519 B1 | * | 6/2004 | Satya et al. ................. 700/121 |
| 6,795,952 B1 | * | 9/2004 | Stine et al. .................... 716/5 |

* cited by examiner

*Primary Examiner*—Vuthe Siek
*Assistant Examiner*—Tuyen To
(74) *Attorney, Agent, or Firm*—Schmeiser, Olsen & Watts; Robert A. Walsh (57) ABSTRACT

A method and system for predicting manufacturing yield for a proposed integrated circuit The method includes: in the order recited: (a) providing a multiplicity of different integrated circuit library elements in a design database, each library element linked to a corresponding normalization factor in the design database; (b) selecting library elements from the design database to include in a proposed design for the integrated circuit; (c) generating an equivalent circuit count of the proposed design based on the normalization factors and a count of each different library element included in the proposed design; and (d) calculating a predicted manufacturing yield based on the equivalent circuit count, a predicted density of manufacturing defects and an area of the proposed integrated circuit chip.

31 Claims, 7 Drawing Sheets

| NORMALIZED PLANNED DESIGN LIBRARY ELEMENT LIST | | | | |
|---|---|---|---|---|
| LIBRARY ELEMENT | CIRCUIT COUNT | CIRCUIT TYPE | NORMALIZATION FACTOR | EQUIVALENT CIRCUIT COUNT |
| EA1 | 1000 | TA | .5 | 500 |
| EA2 | 1000 | TA | .5 | 500 |
| EB1 | 500 | TB | .75 | 375 |
| EB3 | 200 | TB | .75 | 150 |
| EB10 | 100 | TB | .75 | 75 |
| EC2 | 10 | TC | 2.5 | 25 |
| EC3 | 20 | TC | 2.5 | 50 |
| ED1 | 200 | TD | .5 | 100 |
| ED4 | 150 | TD | .5 | 75 |
| TOTAL | 4950 | | | 1850 |

METHOD FOR MODELING INTEGRATED CIRCUIT YIELD

BACKGROUND OF INVENTION

1. Field of the Invention

The present invention relates to the field of integrated circuit design; more specifically, it relates to a method of predicting manufacturing yield of a proposed integrated circuit design.

2. Background of the Invention

In the present state of the art, accurate yield prediction for an integrated circuit design based on critical area analysis can be performed only after design of the integrated circuit design is complete, while relatively simple and inaccurate die size models are used to predict yield prior to the design being completed. As integrated circuits become increasingly more complex, it is found that the pre and post design yield predictions often do not agree. Financial considerations require a more accurate method for predicating yield and hence cost at the time a new integrated circuit is under consideration. Therefore, a method that accurately predicts yield prior to design completion is required.

SUMMARY OF INVENTION

A first aspect of the present invention is a method for predicting manufacturing yield for a proposed integrated circuit, comprising in the order recited: (a) providing a multiplicity of different integrated circuit library elements in a design database, each library element linked to a corresponding normalization factor in the design database; (b) selecting library elements from the design database to include in a proposed design for the integrated circuit; (c) generating an equivalent circuit count of the proposed design based on the normalization factors and a count of each different library element included in the proposed design; and (d) calculating a predicted manufacturing yield based on the equivalent circuit count, a defect density value and an area of the proposed integrated circuit chip.

A second aspect of the present invention is a method for predicting manufacturing yield for a proposed integrated circuit, comprising in the order recited: (a) assigning different integrated circuit library elements into circuit types according to a user defined list of attributes; (b) compiling a set of yield limiting parameters for each circuit type and determining a normalization factor for each circuit type; (c) selecting library elements from the design database to include in a proposed design for the integrated circuit; (d) generating an equivalent circuit count of the proposed design based on the normalization factors for the circuit types and a count of each different library element included in the proposed design; and (e) calculating a predicted manufacturing yield based on the equivalent circuit count, a predicted density of manufacturing defects and an area of the proposed integrated circuit chip.

A third aspect of the present invention is a computer system comprising a processor, an address/data bus coupled to the processor, and a computer-readable memory unit coupled to communicate with the processor, the memory unit containing instructions that when executed implement a method for predicting manufacturing yield for a proposed integrated circuit, the method comprising the computer implemented steps of: (a) providing a multiplicity of different integrated circuit library elements in a design sign database, each library element linked to a corresponding normalization factor in the design database; (b) selecting library elements from the design database to include in a proposed design for the integrated circuit; (c) generating an equivalent circuit count of the proposed design based on the normalization factors and a count of each different library element included in the proposed design; and (d) calculating a predicted manufacturing yield based on the equivalent circuit count, a predicted density of manufacturing defects and an area of the proposed integrated circuit chip.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

A defect is defined as an imperfection that may or may not cause an electrical failure of an integrated circuit, depending upon the size and location of the defect. Defect density is defined as the number of defects per unit area of an integrated circuit chip. A fault is defined as an electrical failure caused by a defect. Critical area is defined as the portion of the total area of an integrated circuit chip where occurrence of a defect of sufficient size will cause a fault. Fault density is defined as the defect density multiplied by the ratio of the critical area to the total chip area. An integrated circuit technology is defined as a set of masking levels, each masking level having a minimum linewidth for shapes and a minimum spacing between shapes.

A planned integrated circuit design according to the present invention comprises a plurality of library circuit elements organized by circuit types. A library element is defined as a set of devices (i.e. transistors, diodes, resistors, capacitors and inductors) wired together in a circuit that perform a function. A circuit type is a set of library elements that have a common sensitivity to random defects. In the present invention, common sensitivity is defined by normalization factors, so library elements within a circuit type either have the same normalization factor or have normalization factors within a predetermined range of each other.

Library elements of a given integrated circuit design share a common technology, one aspect of which is common minimum groundrules. Minimum groundrules define the smallest linewidths and spaces (shapes) devices may have.

Figure 1:
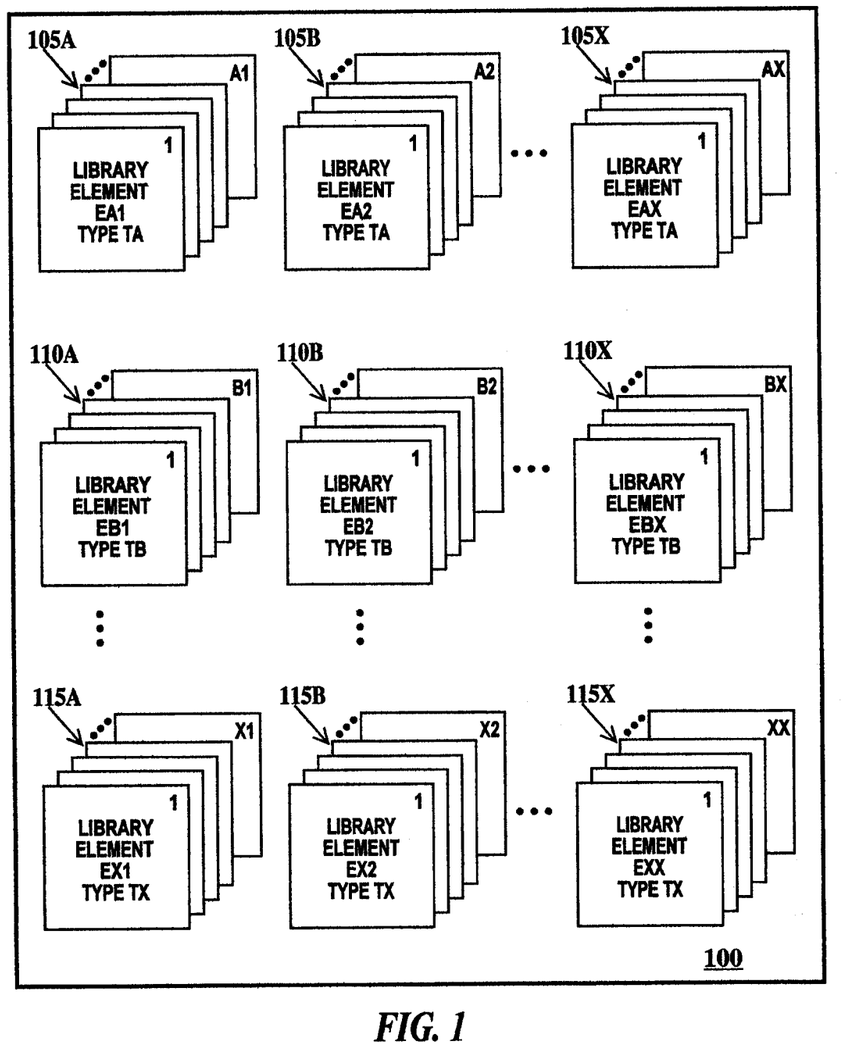
FIG. 1 is a diagram illustrating an exemplary planned integrated circuit design according to the present invention.

FIG. 1 is a diagram illustrating an exemplary planned integrated circuit design 100 according to the present invention. In FIG. 1, Planned integrated circuit 100 includes sets of library elements 105A, 105B through 105X, 110A, 110B through 110X and 115A, 115B through 115X. Sets of library 105A, 105B through 105X are all circuit type TA. Set of library elements 105A include a multiplicity (from 1 to A1) of identical library elements EA1. Set of library elements 105B include a multiplicity (from 1 to A2) of identical library elements EA2. Set of library elements 105X include a multiplicity (from 1 to AX) of identical library elements EAX. Set of library elements 110A include a multiplicity (from 1 to B1) of identical library elements EB1. Set of library elements 110B include a multiplicity (from 1 to B2) of identical library elements EB2. Set of library elements 110X include a multiplicity (from 1 to BX) of identical library elements EBX. Set of library elements 115A include a multiplicity (from 1 to X1) of identical library elements EX1. Set of library elements 115B include a multiplicity (from 1 to X2) of identical library elements EX2. Set of library elements 115X include a multiplicity (from 1 to XX) of identical library elements EXX.

The groupings of circuit elements are not representative of the physical layout of an integrated circuit chip or of the sequence that library elements and/or circuit types are selected, but rather reflect a logical organization of planned integrated circuit design that the present invention generates and operates upon.

Figure 2A:
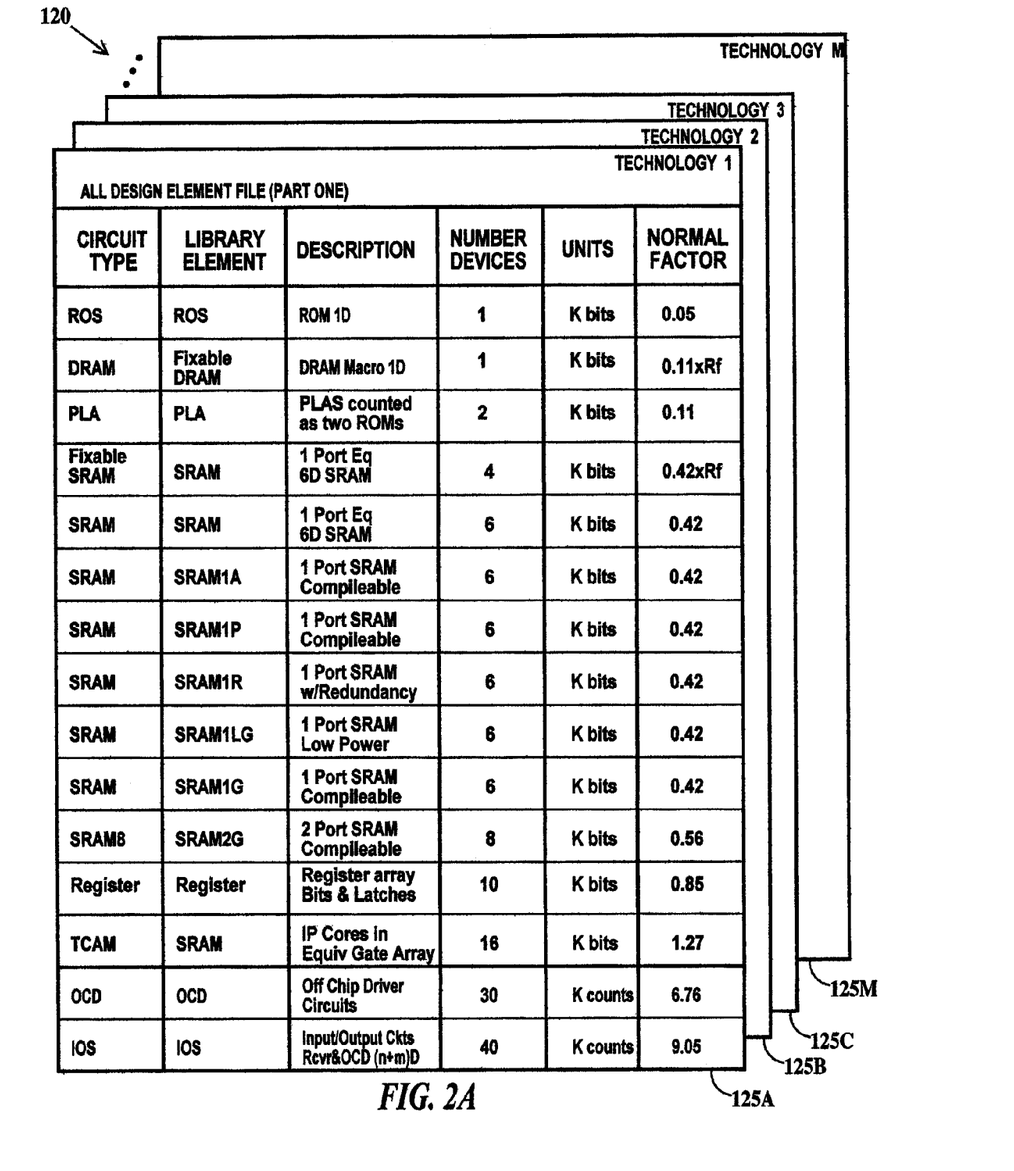
FIGS. 2A and 2B are exemplary tables illustrating a portion of a design database according to the present invention.
Figure 2B:
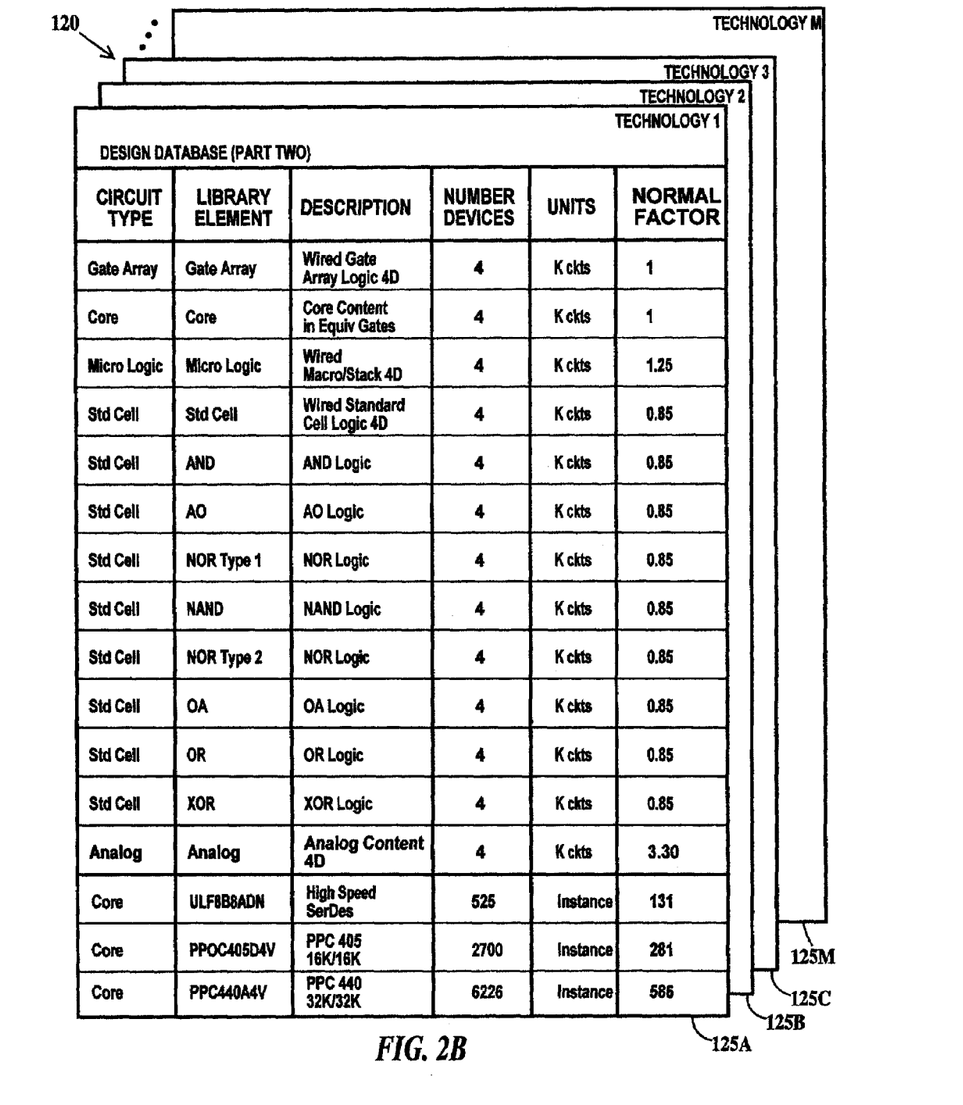

FIGS. 2A and 2B are exemplary tables illustrating a portion of a design database 120 according to the present invention. FIG. 2B is a continuation of FIG. 2A. In FIGS. 2A and 2B a multiplicity of technology based design element files 125A, 125B, 125C through 125M. Each design element list includes all the library elements a designer may choose from when planning and then implementing a planned integrated circuit design. FIGS. 2A and 2B include a circuit type column, a library element column, a description column, a number of devices column, a units column and a normalization factor column. Memory or logic tag, analog or digital tag, circuit function, circuit complexity, number and type of masking levels, number of devices, redundancy and shape density are examples of attributes of library elements that determine normalization factors. Not all columns actually contained in design element list 125A, 125B, 125C through 125M of design database 120 are illustrated in FIGS. 2A and 2B. For example, columns required for critical area analysis yield such as critical area by circuit type and defect type are not illustrated. Similarly, the portion of design database 120 that stores planned designs, completed designs and various yield predictions is not illustrated.

Large library elements (cores) are composed of smaller and less complex library elements and can be represented by referencing the smaller and less complex library elements in the tables of FIGS. 2A and 2B. The invention provides for cores to be described in a proposed design as a list of library elements in the tables of FIGS. 2A and 2B. The equivalent circuit count for the core is then calculated by adding up the equivalent circuit counts of the library elements used to construct the core.

The circuit type and the library element columns constitute a library elements list 130 (see FIG. 3) that allows cross-reference between library elements and circuit types. The circuit type and normalization factor columns constitute a normalization factor list 135 (see FIG. 3) that allows cross-reference between circuit types and normalization factors. Normalization factors are multipliers that may be applied to different library elements to compensate for the fact that different library elements have different sensitivity to the same defect. Normalization factors are used by the present invention to correct the number of faults predicted to be generated by a given number of defects for each library element. It should be noted that memory library elements are normalized to thousands of bits, basic logic library elements are normalized to thousands of circuits, input, output and driver circuits are normalized to thousands of counts (circuits) and cores are normalized to instances (the actual number of cores). Cores are very large collections of design elements that are pre-designed in design-database 120. Thus not only are different design element sensitivity accounted for by the normalization factors, but also the difference in sensitivity between memory, logic and very large logic circuits to the same defect.

Normalization factor are "experimentally" determined based on yield and failure analysis of manufactured integrated circuits. Normalization factors are insensitive to defect size and individual design element critical area by the nature of the method used to generate them.

In the present example, a 1000 circuit, gate array circuit type is the base (see FIG. 2B first row) has a base other normalization factor of 1.0. Circuit types having a normalization factor less than 1 are less sensitive to the same defect and those having a normalization factor greater than 1 are more sensitive to the same defect. For example, a 1000, 6-device SRAM cells (See FIG. 2A, normalization factor 0.42) have about the same sensitivity to a single defect as approximately 500, 4-device standard logic cells (See FIG. 2B, normalization factor 0.85) based on the ratio of their normalization factors (0.42/0.85).

Examples of circuit types include but are not limited to read only storage (ROS). dynamic random access memory (DRAM), static random access memory (SRAM), registers, ternary content addressable memories (TCAM), off chip drivers (OCD). input/output circuits (I/O), gate arrays., micro logic, standards cells (logic gates) analog circuits and cores. Examples of library elements include ROS, DRAM, PLA, SRAM, registers, ICD, I/O, gate arrays, micro logic, AND, OR, NAND, NOR, AND/OR (AO), OR/AND (OA) logic gates analog circuits and micro-processors such as power PC.

Figure 3:
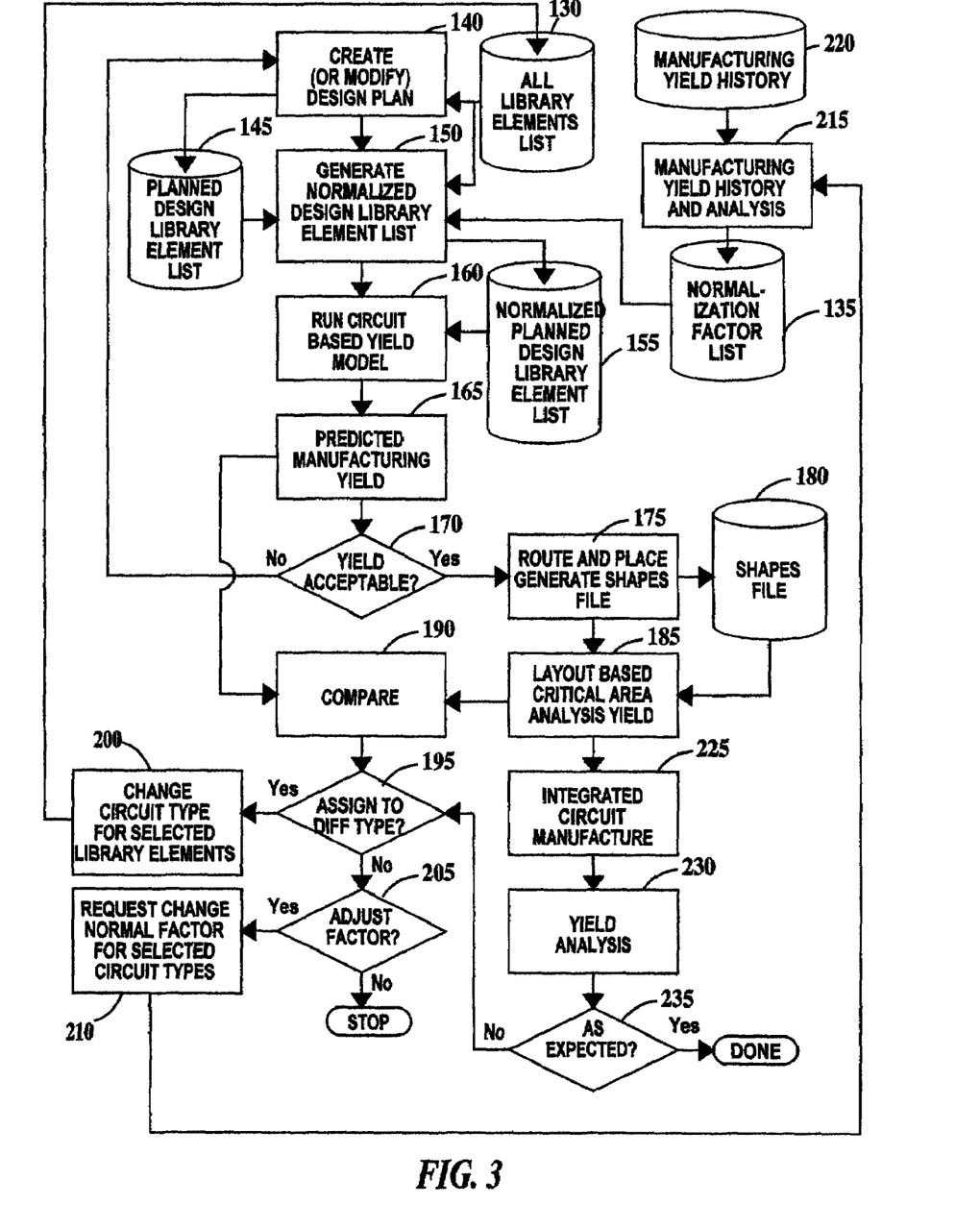
FIG. 3 is a flowchart of the method for predicting manufacturing yield of an integrated circuit, according to the present invention.
Figure 4:
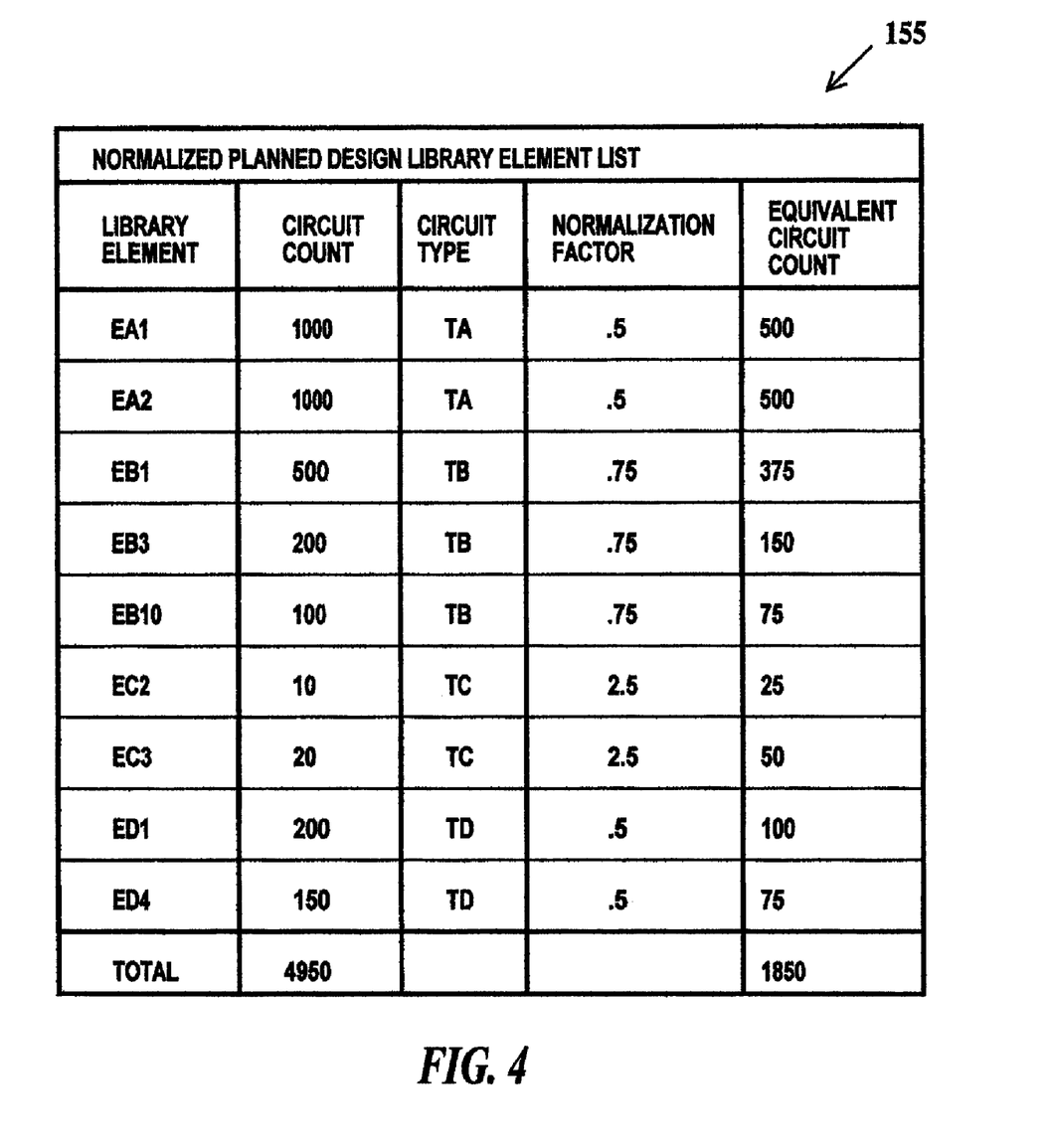
FIG. 4 is an exemplary table illustrating a list of planned integrated circuit design library elements according to the present invention.

FIG. 3 is a flowchart of the method for predicting manufacturing yield of an integrated circuit, according to the present invention. In step 140, a plan for an integrated circuit design (a proposed design) is generated by selecting design elements to include in the proposed integrated circuit (or an existing plan for an integrated circuit design is modified) and a planned design library element list 145 generated. Planned design library element list 145 includes at least a listing of every instance of every design element (multiple design elements having multiple entries). Next in step 150, a normalized planned design library list 155 is generated. This includes a list of each different library element and a normalized count of each different library element. Normalized planned design library list 155 is generated by (1) accessing planned design library element list 145 to obtain the count of each different design element; (2) accessing library elements list 130 to obtain the circuit type for each different library element; (3) accessing normalization factor list 135 to obtain the normalization factor to apply to the count of each different design element and (4) multiplying the corresponding normalization factors and design element counts to generate an equivalent circuit count for each different design element. This process and the resultant normalized planned design library element list 155 is illustrated in FIG. 4 and described infra. Planned design library element list 145 and normalized planned design library element list 155 are part of database 120 (see FIGS. 2A and 2B).

Next in step 160, a circuit based yield model is run using the equivalent circuit count generated in step 150 and the total area of the proposed integrated circuit. It should be noted, that at this point, an actual integrated circuit design has not been generated, all that exists is a list of design elements to be included in the integrated circuit design. The circuit based yield model essentially applies a defect density versus time curve (for a given technology) to the equivalent circuit count for each design element to generate a predicted manufacturing yield in step 165. The circuit based model is described more fully infra in relation to FIGS. 5 and 6.

Next, in step 170, it is determined if the predicted yield is acceptable (e.g. meets cost projections). If the projected yield is acceptable, the method proceeds to step 175, otherwise the method loops back to step 140, where the current proposed integrated circuit design as embodied by planned design library element list 145 may be modified or abandoned.

In step 175, the actual integrated design is generated by route and place operations and a shapes file 180 is generated. Shapes file 180 is part of design database 120 (see FIGS. 2A and 2B) and contains level-by-level shape data for generating photolithography masks used to manufacture the integrated circuit.

Next, in step 185, a layout based critical area yield analysis is performed. An example of this type of analysis is illustrated in equation (1).

$$Y(t)=Y_o(t)/(1+\lambda(t)/\alpha)^\alpha \qquad (1)$$

where:
Y(t)=predicted wafer test yield;
$Y_o$(t)=gross systematic yield;
$\lambda$(t)=total chip fault density; and
$\alpha$=cluster factor.

The gross systematic yield is yield loss due to non-random defects and includes such causes as process control and capability limitations and product topology effects. The cluster factor takes into account that random defects are not uniformly distributed, but tend to cluster so adjacent chips fail. The total chip fault density is defined in equation (2).

$$\lambda(t) = \sum_{j=1}^{Nc} Cj \sum_{i=1}^{Nd} AijDiF(t) \qquad (2)$$

where:
Cj=number of circuits of type j;
Aij=ratio of critical area to total area of circuit type j to defect type i;
Di=defect density of defect type i;
F(t)=learning factor;
Nc=number of different circuit types; and
Nd=number of different defect types.

The learning factor is a reduction of defect density over time.

It should be noted, that the method provides two opportunities to "tune" the circuit based yield model of the present invention. To this end, in step 190 the yield predicted by the critical area analysis model in step 185 may be compared to the yield predicted by the circuit based yield model of the present invention in step 165. This comparison may be performed any time after the critical area analysis yield is available and can be delayed or even not performed. Based on the comparison two independent decisions can be made to increase the accuracy of the circuit based yield model of the present invention. First in step 195, the decision can be made to assign selected designed elements to a different circuit type, which will change the normalization factor for the selected library elements. This is done in step 200 by modification of library elements list 130. Second in step 205, the decision can be made to adjust the normalization factor for selected circuit types, which will result in a change of normalization factor for all design elements of that type. Step 210 requests new normalization factors which are generated in step 215 after analysis of a manufacturing yield history database 220 and the changes incorporated in normalization factor list 135. Manufacturing yield history database 220 includes a list of manufacturing yield-limiting parameters by circuit type. Normalization factor are generated based upon these parameters.

After step 185, the integrated circuit is manufactured in step 225 and yield analysis (including electrical and physical failure analysis) performed in step 230. In step 235, if the actual yield is as expected based on the predicted manufacturing yield of step 165, the method terminates. If not, then the method can loop to step 195 where a second opportunity to "tune" the circuit based yield model of the present invention is afforded. Again, this "tuning" may be performed any time after the actual manufacturing yield analysis is available and can be delayed or even not performed. It is important to realize the present invention is not only a method of predicting manufacturing test yield based on a listing of planned library elements before the actual design is started, but includes a method and system of improving the accuracy of the model itself.

FIG. 4 is an exemplary table illustrating a list of planned integrated circuit design library elements according to the present invention. In FIG. 4, normalized planned design library element list includes a library element column, a circuit count column, a circuit type column, a normalization factor column and an equivalent circuit count column. It should be noted that the normalization factor for all design elements of the same circuit type is the same. It should also be noted that it is possible for two circuit types to have the same normalization factor (for example circuit types TA and TD). In the example of FIG. 4, the actual circuit count is 4950 (there are 4950 instances of design elements) while the equivalent circuit count is 1850 (the design will behave yield wise the same as a design having 1850 design elements having a normalization factor of 1.0.

Figure 5:
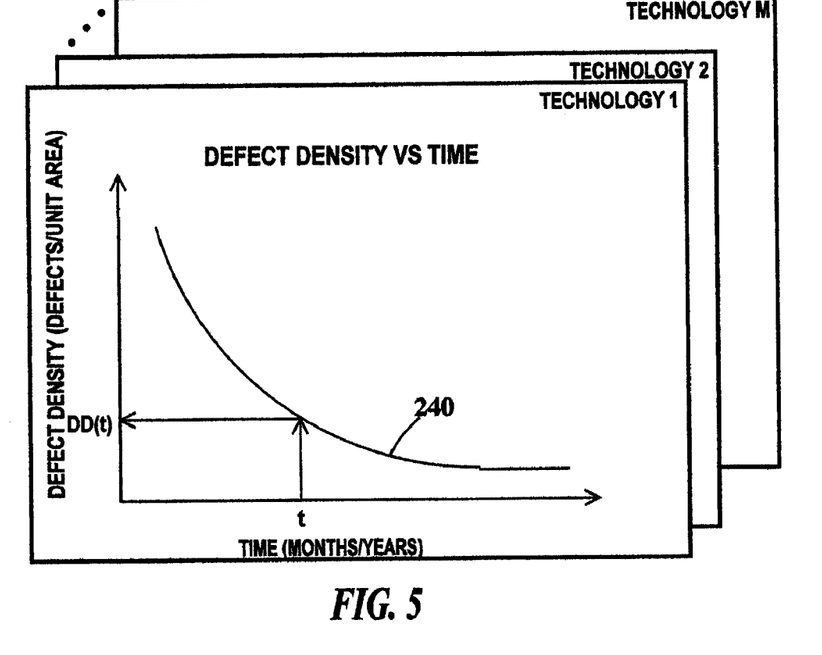
FIG. 5 is an exemplary plot of defect density versus yield by technology as used by the present invention.

FIG. 5 is an exemplary plot of defect density versus time by technology as used by the present invention. In FIG. 5, defect density is seen to be a function not only of time but also of technology. In order to predict yield, first the expected time of manufacture, t of the integrated circuit is found on a defect versus time curve 240 and the corresponding defect density DD(t) is determined. The value of DD(t) is applied to the normalized circuit count in FIG. 6.

Figure 6:
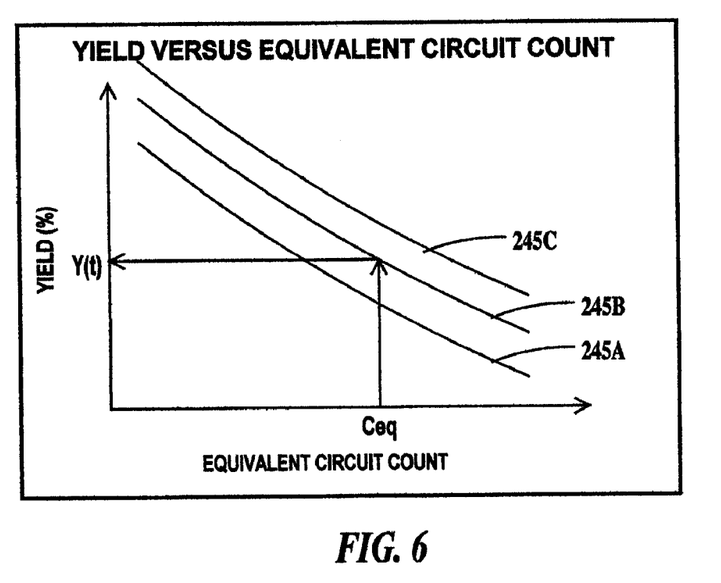
FIG. 6 is an exemplary plot of yield versus normalized circuit count by technology according to the present invention.

FIG. 6 is an exemplary plot of yield versus normalized circuit count by chip size according to the present invention. In the example of FIG. 6, three yield versus equivalent circuit count curves 245A, 245B and 245C are illustrated. Each of curves 245A, 245B and 245C correspond to a different chip size. If curve 245B corresponds to the planned integrated circuit design chip size, the equivalent circuit count Ceq is found and the corresponding yield Y(t) is read.

While a graphical method of applying the defect density curve to the equivalent circuit count has been described supra, the defect density curve may be applied mathematically as well as described by replacing equation (2) described supra with equation (3).

$$\lambda(t) = Ceq\, DD(t) A \quad (3)$$

where:

Ceq=number of equivalent circuits;
A=estimated ratio of critical area to total area; and
DD(t)=defect density as a function of time.

Estimated chip area may be determined by adding the areas (from the design database) of each individual design element in the proposed integrated circuit design or may be assigned by the designer.

Figure 7:
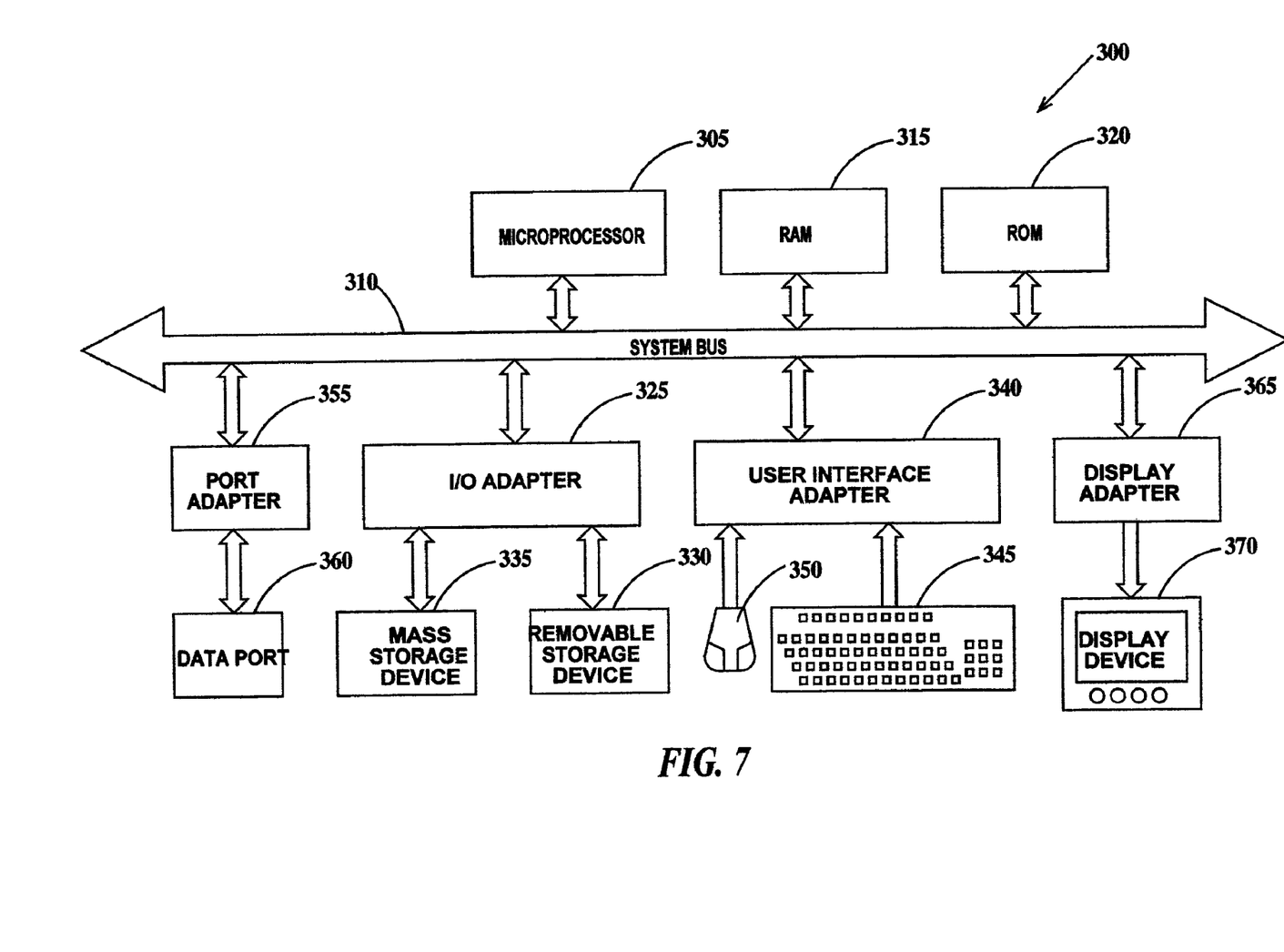
FIG. 7 is a schematic block diagram of a general-purpose computer for practicing the present invention.

Generally, the method for modeling integrated circuit yield described herein is practiced with a general-purpose computer and the method may be coded as a set of instructions on removable or hard media for use by the general-purpose computer. FIG. 7 is a schematic block diagram of a general-purpose computer for practicing the present invention. In FIG. 7, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 330 include magnetic media such as floppy drives and tape drives and optical media such as CD ROM drives. Examples of mass data and/or program storage device 335 include hard disk drives and non-volatile memory such as flash memory. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 330, fed through data port 360 or typed in using keyboard 345.

Thus, the present invention supplies a method for accurately predicting integrated circuit yield prior to design completion is required.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A method for predicting manufacturing yield for a proposed integrated circuit, comprising in the order recited:
   (a) providing a multiplicity of different integrated circuit library elements in a design database, each library element linked to a corresponding normalization factor in said design database;
   (b) selecting library elements from said design database to include in a proposed design for said integrated circuit;
   (c) generating an equivalent circuit count of said proposed design based on said normalization factors and a count of each different library element included in said proposed design; and
   (d) calculating a predicted manufacturing yield based on said equivalent circuit count, a predicted density of manufacturing defects and an area of said proposed integrated circuit chip.

2. The method of claim 1 wherein step (c) includes multiplying each count of each different library element included in said proposed design by said corresponding normalization factors to obtain a set of normalized circuit counts by said different design elements and summing said set of normalized circuit counts to obtain said equivalent circuit count for said proposed design.

3. The method of claim 1, further including after step (d):
   (e) determining if said predicted manufacturing yield for said proposed design meets predetermined criteria; and
   if said predicted manufacturing yield does not meet said predetermined criteria, changing one or more design elements or design element counts and repeating steps (b) through (e).

4. The method of claim 1, further including after step (d):
   generating a completed design for said integrated circuit;
   performing a critical area yield analysis to determine a critical area analysis yield of said completed design;
   comparing said critical area analysis yield to said predicted manufacturing yield; and
   based on said comparison, changing normalization factors for selected library elements in said design database.

5. The method of claim 1, further including:
   manufacturing said integrated circuit;
   analyzing the yield of said integrated circuit; and
   based on said analysis of yield of said integrated circuit, changing said normalization factors for selected library elements in said design database.

6. The method of claim 1, wherein said library elements are linked to said normalization factors by assigning each different library element of said design database to one of a multiplicity of circuit types and assigning said normalization factors to said circuit types.

7. The method of claim 6, further including after step (d):
   generating a completed design for said integrated circuit;
   performing a critical area yield analysis of said completed design;
   comparing said critical area yield analysis to said predicted manufacturing yield; and
   based on said comparison, changing the circuit type of selected design elements or changing the normalization factor for selected circuit types of said multiplicity of circuit types.

8. The method of claim 6, further including
   manufacturing said integrated circuit;
   analyzing the yield of said integrated circuit; and
   based on said analysis of yield of said integrated circuit, changing the circuit type of selected design elements or changing the normalization factor for selected circuit types of said multiplicity of circuit types.

9. The method of claim 1, wherein said normalization factors are based on analysis of the effect of a multiplicity of different circuit types on manufacturing yield of a multiplicity of different integrated circuits.

10. The method of claim 1, wherein said normalization factors normalize memory library elements by bit count and logic library elements by circuit count.

11. The method of claim 1, wherein said defect density value is a function of technology and time.

12. A method for predicting manufacturing yield for an integrated circuit, comprising in the order recited:
   (a) assigning different integrated circuit library elements into circuit types according to a user defined list of attributes;
   (b) compiling a set of yield limiting parameters for each circuit type and determining a normalization factor for each circuit type;
   (c) selecting library elements from said design database to include in a proposed design for said integrated circuit;
   (d) generating an equivalent circuit count of said proposed design based on said normalization factors for said circuit types and a count of each different library element included in said proposed design; and
   (e) calculating a predicted manufacturing yield based on said equivalent circuit count, a defect density value and an area of said proposed integrated circuit chip.

13. The method of claim 12 wherein step (d) includes multiplying each count of each different library element included in said proposed design by said corresponding normalization factors for said circuit type that each design element is assigned to in order to obtain a set of normalized circuit counts by said different design elements and summing said set of normalized circuit counts to obtain said equivalent circuit count for said proposed design.

14. The method of claim 12, further including after step (e):
   (f) determining if said predicted manufacturing yield for said proposed design meets predetermined criteria; and
   if said predicted manufacturing yield does not meet said predetermined criteria, changing one or more design elements or design element counts and repeating steps (c) through (f).

15. The method of claim 12, further including after step (e):
   generating a completed design for said integrated circuit;
   performing a critical area yield analysis to determine a critical area analysis yield of said completed design;
   comparing said critical area analysis yield to said predicted manufacturing yield; and
   based on said comparison, changing the circuit type of selected design elements or changing the normalization factor for selected circuit types of said multiplicity of circuit types.

16. The method of claim 12, further including
   manufacturing said integrated circuit;
   analyzing the yield of said integrated circuit; and
   based on said analysis of yield of said integrated circuit, changing the circuit type of selected design elements or changing the normalization factor for selected circuit types of said multiplicity of circuit types.

17. The method of claim 12, wherein said normalization factors are based on analysis of the effect of a multiplicity of different circuit types on manufacturing yield of a multiplicity of different integrated circuits.

18. The method of claim 12, wherein said normalization factors normalize memory library elements by bit count and logic library elements by circuit count.

19. The method of claim 12, wherein said defect density value is a function of technology and time.

20. The method of claim 12, wherein said attributes include one or more of a memory or logic tag, analog or digital tag, circuit function, circuit complexity, number and type of masking levels, number of devices, redundancy and shape density for each library element.

21. A computer system comprising a processor, an address/data bus coupled to said processor, and a computer-readable memory unit adapted to be coupled to said processor, said memory unit containing instructions that when executed by said processor implement a method for predicting manufacturing yield for an integrated circuit, said method comprising the computer implemented steps of:
   (a) providing a multiplicity of different integrated circuit library elements in a design database, each library element linked to a corresponding normalization factor in said design database;
   (b) selecting library elements from said design database to include in a proposed design for said integrated circuit;
   (c) generating an equivalent circuit count of said proposed design based on said normalization factors and a count of each different library element included in said proposed design; and
   (d) calculating a predicted manufacturing yield based on said equivalent circuit count, a predicted density of manufacturing defects and an area of said proposed integrated circuit chip.

22. The system of claim 21 wherein step (c) includes multiplying each count of each different library element included in said proposed design by said corresponding normalization factors to obtain a set of normalized circuit counts by said different design elements and summing said set of normalized circuit counts to obtain said equivalent circuit count for said proposed design.

23. The system of claim 21, the method further including after step (d) the steps of:
   (e) determining if said predicted manufacturing yield for said proposed design meets predetermined criteria; and
   if said predicted manufacturing yield does not meet said predetermined criteria, changing one or more design elements or design element counts and repeating steps (b) through (e).

24. The system of claim 21, the method further including after step (d) the steps of:
   generating a completed design for said integrated circuit;
   performing a critical area yield analysis to determine a critical area analysis yield of said completed design;
   comparing said critical area analysis yield to said predicted manufacturing yield; and
   based on said comparison, changing normalization factors for selected library elements in said design database.

25. The system of claim 21, the method further including:
   manufacturing said integrated circuit;
   analyzing the yield of said integrated circuit; and
   based on said analysis of yield of said integrated circuit, changing said normalization factors for selected library elements in said design database.

26. The system of claim 21, wherein said library elements are linked to said normalization factors by assigning each different library element of said design database to one of a multiplicity of circuit types and assigning said normalization factors to said circuit types.

27. The system of claim 26, the method further including after step (d) the steps of:

generating a completed design for said integrated circuit;

performing a critical area yield analysis of said completed design;

comparing said critical area yield analysis to said predicted manufacturing yield; and based on said comparison, changing the circuit type of selected design elements or changing the normalization factor for selected circuit types of said multiplicity of circuit types.

28. The system of claim 26, the method further including the steps of:

manufacturing said integrated circuit;

analyzing the yield of said integrated circuit; and based on said analysis of yield of said integrated circuit, changing the circuit type of selected design elements or changing the normalization factor for selected circuit types of said multiplicity of circuit types.

29. The system of claim 21, wherein said normalization factors are based on analysis of the effect of a multiplicity of different circuit types on manufacturing yield of a multiplicity of different integrated circuits.

30. The system of claim 21, wherein said normalization factors normalize memory library elements by bit count and logic library elements by circuit count.

31. The system of claim 21, wherein said defect density value is a function of technology and time.

* * * * *

UNITED STATES PATENT AND TRADEMARK OFFICE
CERTIFICATE OF CORRECTION

PATENT NO. : 7,013,441 B2
APPLICATION NO. : 10/605379
DATED : March 14, 2006
INVENTOR(S) : Bickford et al.

It is certified that error appears in the above-identified patent and that said Letters Patent is hereby corrected as shown below:

<u>Column 1</u>
Line 65, delete "sign"

Signed and Sealed this

Eighteenth Day of July, 2006

JON W. DUDAS
*Director of the United States Patent and Trademark Office*